(12) United States Patent
Hong

(10) Patent No.: US 8,624,120 B2
(45) Date of Patent: Jan. 7, 2014

(54) TWO-SIDE CABLE-ARRANGEMENT STRUCTURE AND ELECTRONIC APPARATUS THEREWITH

(75) Inventor: Yu-Chang Hong, Taipei County (TW)

(73) Assignee: HannStar Display Corp., Taipei County (TW)

( * ) Notice: Subject to any disclaimer, the term of this patent is extended or adjusted under 35 U.S.C. 154(b) by 382 days.

(21) Appl. No.: 12/953,466

(22) Filed: Nov. 24, 2010

(65) Prior Publication Data

US 2012/0000702 A1 Jan. 5, 2012

(30) Foreign Application Priority Data

Jul. 2, 2010 (TW) ................................ 99121824 A

(51) Int. Cl.
*H01B 7/00* (2006.01)

(52) U.S. Cl.
USPC ............ 174/135; 174/138 E; 174/98; 174/97; 174/262; 174/506

(58) Field of Classification Search
USPC .................... 174/135, 138 E, 506, 480, 98, 97
See application file for complete search history.

(56) References Cited

U.S. PATENT DOCUMENTS

| | | | | | |
|---|---|---|---|---|---|
| 3,419,670 | A | * | 12/1968 | Schneider | 174/135 |
| 4,224,465 | A | * | 9/1980 | Ruzic | 174/135 |
| 4,911,510 | A | * | 3/1990 | Jenkins | 385/136 |
| 5,952,616 | A | * | 9/1999 | Morrow | 174/135 |
| 6,846,990 | B2 | * | 1/2005 | Kisu et al. | 174/138 E |
| 2007/0202743 | A1 | * | 8/2007 | Mikami | 439/587 |

FOREIGN PATENT DOCUMENTS

| | | |
|---|---|---|
| TW | M304947 | 1/2007 |
| TW | 1293412 | 2/2008 |

\* cited by examiner

*Primary Examiner* — Tuan T Dinh
*Assistant Examiner* — Steven Sawyer
(74) *Attorney, Agent, or Firm* — Winston Hsu; Scott Margo

(57) ABSTRACT

A two-side cable-arrangement structure is disclosed. The two-side cable-arrangement structure includes a plate, a first cable-arrangement structure, and a second cable-arrangement structure. The first cable-arrangement structure and the second cable-arrangement structure are respectively disposed on two sides of the plate. A cable is fixed on the two sides of the plate by the first cable-arrangement structure and the second cable-arrangement structure simultaneously. Thereby, the cable is constrained at both the direction vertical toward the plate and the direction vertical away from the plate, and the fixed cable is not easy to move by pulling. It solves the difficulty of fixing a cable completely by a conventional single-side cable-arrangement structure in the prior art.

13 Claims, 7 Drawing Sheets

TWO-SIDE CABLE-ARRANGEMENT STRUCTURE AND ELECTRONIC APPARATUS THEREWITH

BACKGROUND OF THE INVENTION

1. Field of the Invention

The invention relates to a two-side cable-arrangement and an electronic apparatus therewith, and especially relates to a two-side cable-arrangement and an electronic apparatus therewith using reciprocal effect by two cable arrangement structures disposed oppositely to enhance immobility of a cable.

2. Description of the Prior Art

As electronic technology progresses, various electronic apparatuses are developed continuously. Most of electronic components in the electronic apparatus are integrated into a print circuit board, but some electronic modules are still electrically connected with cables. These connection cables or cables with other functions (such as antenna, power cable and so on) are often accommodated by hanging in the casing of the electronic apparatus. In order to avoid improperly tangling the cables and shorting the cables with other electronic components, or in order to effectively dispose the cables for improving efficiency of later maintenance, the electronic apparatus often includes cable-arrangement structures disposed in the interior to solve the above problems.

Please refer to FIG. 1, which is a schematic diagram of a single-side cable-arrangement structure 1 according to the prior art. In this embodiment, the single-side cable-arrangement structure 1 is disposed at a corner of a casing 12 for fixing a cable 2. The single-side cable-arrangement structure 1 consists mainly of ribs 14, 16 disposed in parallel. The ribs 14, 16 form a passage 18 therebetween. The cable 2 can be accommodated in the passage 18. In addition, there are several protrusion spots 142, 162 disposed on the side walls of the passage 18 for fixing the cable 2 in the passage 18 firmly. The cable 2 passes through a through hole 122 to the exterior of the casing 12. In this embodiment, the cable 2 is constrained in plane directions, but when a user outside the casing 12 pushes the cable 2 in, it is quite easy for the cable 2 to depart along a direction 124 perpendicular to the casing 12 from the passage 18, so that the whole cable 2 departs from the single-side cable-arrangement structure 1.

Please refer to FIG. 2, which is a schematic diagram of the single-side cable-arrangement structure 1 on which an adhesive tape 20 is pasted. The adhesive tape 20 is shown in dashed lines. In view of the problem of departing, a conventional method is to paste an adhesive tape over the whole single-side cable-arrangement structure 1 and the cable 2 additionally to prevent the cable 2 from departing, shown as FIG. 2. However, as time goes by, the stickiness of the adhesive tape 20 decays till the adhesive tape 20 peels off. At this time, the abovementioned problem of departing also appears.

Please refer to FIG. 3, which is a schematic diagram of another single-side cable-arrangement structure 3 according to the prior art. In this embodiment, the single-side cable-arrangement structure 3 is used for fixing an electronic component 4 (such as infrared lens) and wires 42 connected thereto. The single-side cable-arrangement structure 3 uses ribs 32 thereof to clip the wires 42 for the purpose of fixing the electronic component 4 and the wires 42 connected thereto. However, the way of fixing objects through the reciprocal resilient force induced by the deformation of the ribs 32 under the compression by the wires 42 needs a coordinating structure size, so the way is usually applied to a special assembly of components (such as the assembly of the electronic component 4 and the wires), not widely to the fixing on a single cable.

SUMMARY OF THE INVENTION

An objective of the invention is to provide a two-side cable-arrangement structure for fixing a cable. The two-side cable-arrangement structure uses two cable-arrangement structures on two sides thereof to individually constrain the cable to produce the reciprocal effect so that the cable can be fixed firmly in each direction so as to solve the problem of the cable departing in the prior art.

The two-side cable-arrangement structure of the invention includes a plate, a first cable-arrangement structure, and a second cable-arrangement structure. The plate has a first side and a second side. The first side is opposite to the second side. The first cable-arrangement structure is disposed on the first side for fixing a first portion of the cable on the first side. The second cable-arrangement structure is disposed on the second side for fixing a second portion extending from the first portion of the cable on the second side.

Because the cable is fixed on the two opposite sides of the plate simultaneously, using the free portion of the cable at the second side to loosen the cable at the first side needs to overcome the constraint on the second portion of the cable by the second cable-arrangement structure, and vice versa. Furthermore, the cable is fixed by the two cable-arrangement structures simultaneously, so a constraint force is produced between the first portion and the second portion of the cable. The constraint force is not based on the cable-arrangement structure itself, but based on the existence of the other cable-arrangement structure, so the relative disposal of the two cable-arrangement structures affects the constraint force. In the two-side cable-arrangement structure of the invention, the first cable-arrangement structure and the second cable-arrangement structure are disposed on the two sides of the plate respectively, so the constraint force thereof is larger than the constraint force produced by two cable-arrangement structures disposed at the same side.

Another objective of the invention is to provide an electronic apparatus with the two-side cable-arrangement structures of the invention. The electronic apparatus includes a casing additionally. The casing is engaged with the plate. The casing has a through hole for the cable to pass through to the exterior of the casing. Besides the electronic apparatus having the effect of the above two-side cable-arrangement structure, the cable is constrained further by the through hole. For example, the through hole is not opposite right to the cable-exit position of the two-side cable-arrangement structure, so it is harder for a user from the exterior of the electronic apparatus to directly loosen the portions of the cable fixed by the two-side cable-arrangement structure.

Therefore, the two-side cable-arrangement structure and the electronic apparatus with the two-side cable-arrangement structure of the invention can fix the cable firmly. The fixed portions of the cable are difficult to be loosened even though a user pulls out or pushes in the cable outside the electronic apparatus. The cable is therefore fixed effectively, which solves the problem that the single cable-arrangement structure in the prior art cannot fix a cable in multiple directions.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
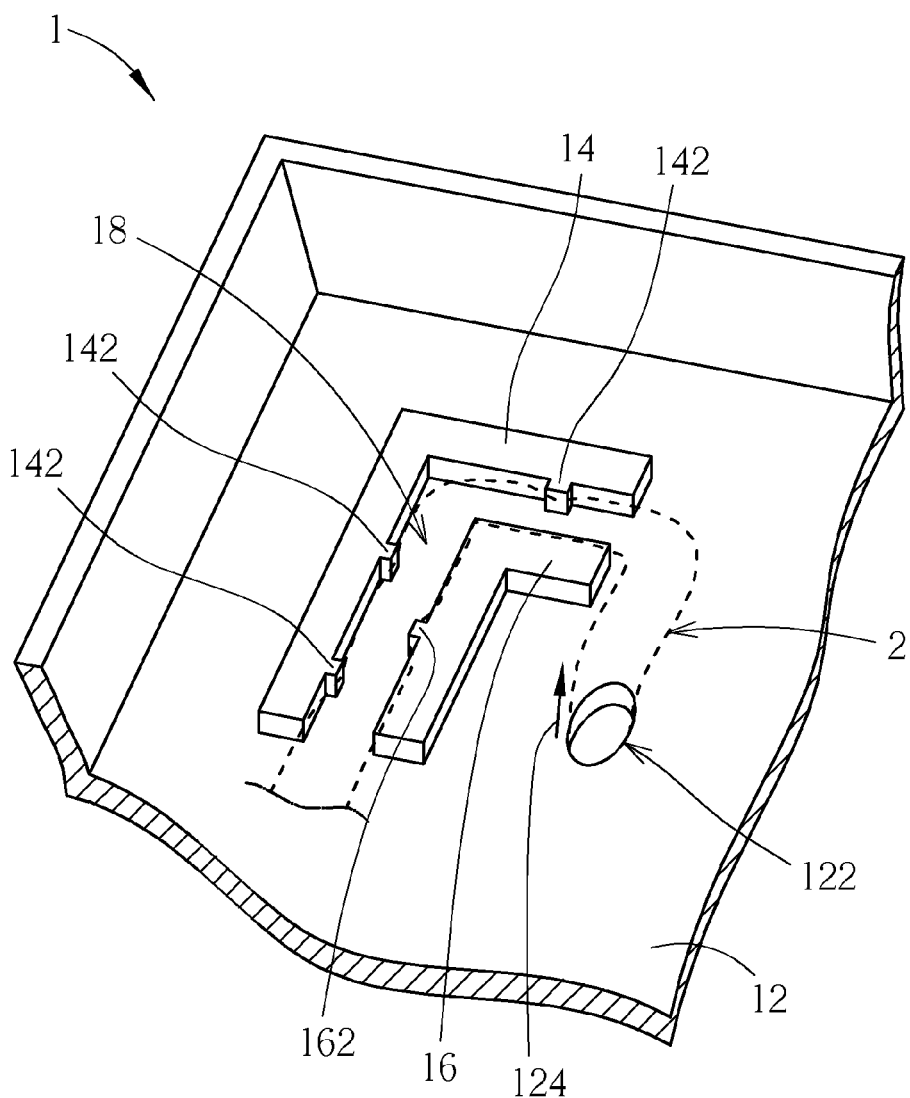
FIG. 1 is a schematic diagram of a single-side cable-arrangement structure according to the prior art.
Figure 2:
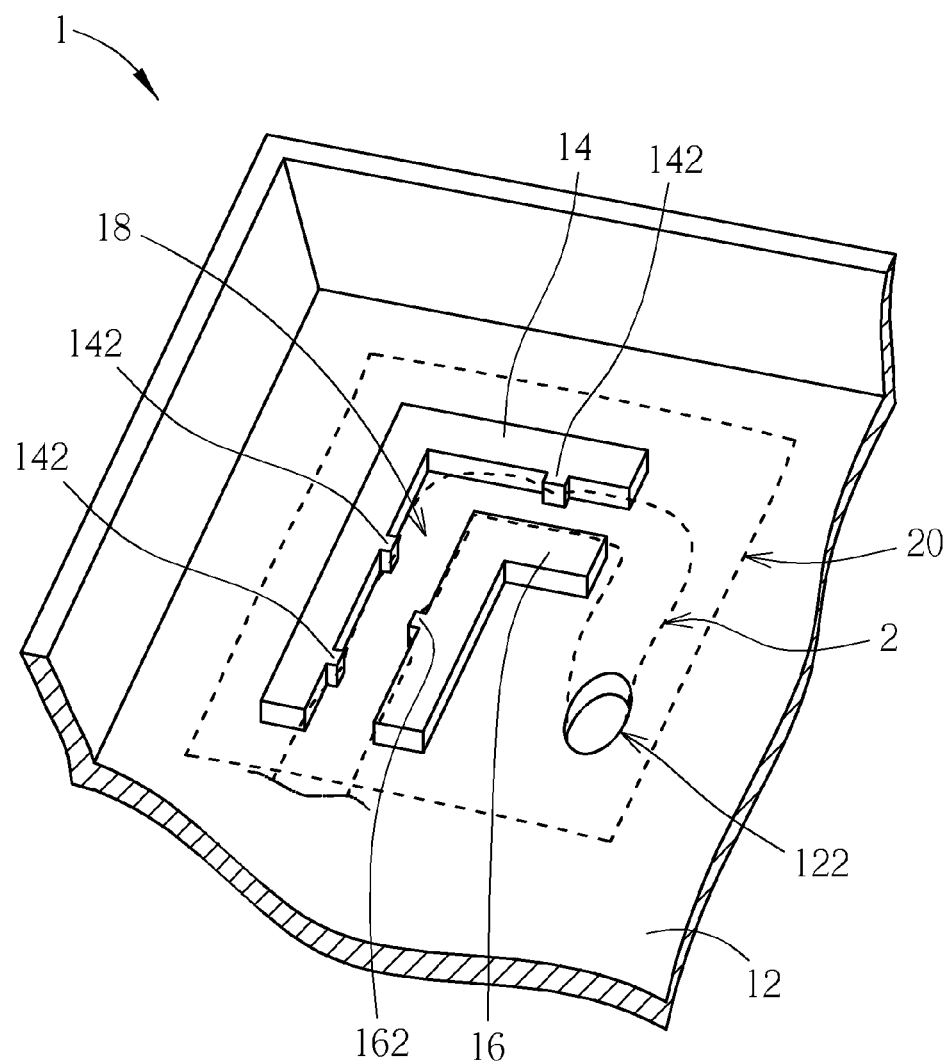
FIG. 2 is a schematic diagram of the single-side cable-arrangement structure on which an adhesive tape is pasted.
Figure 3:
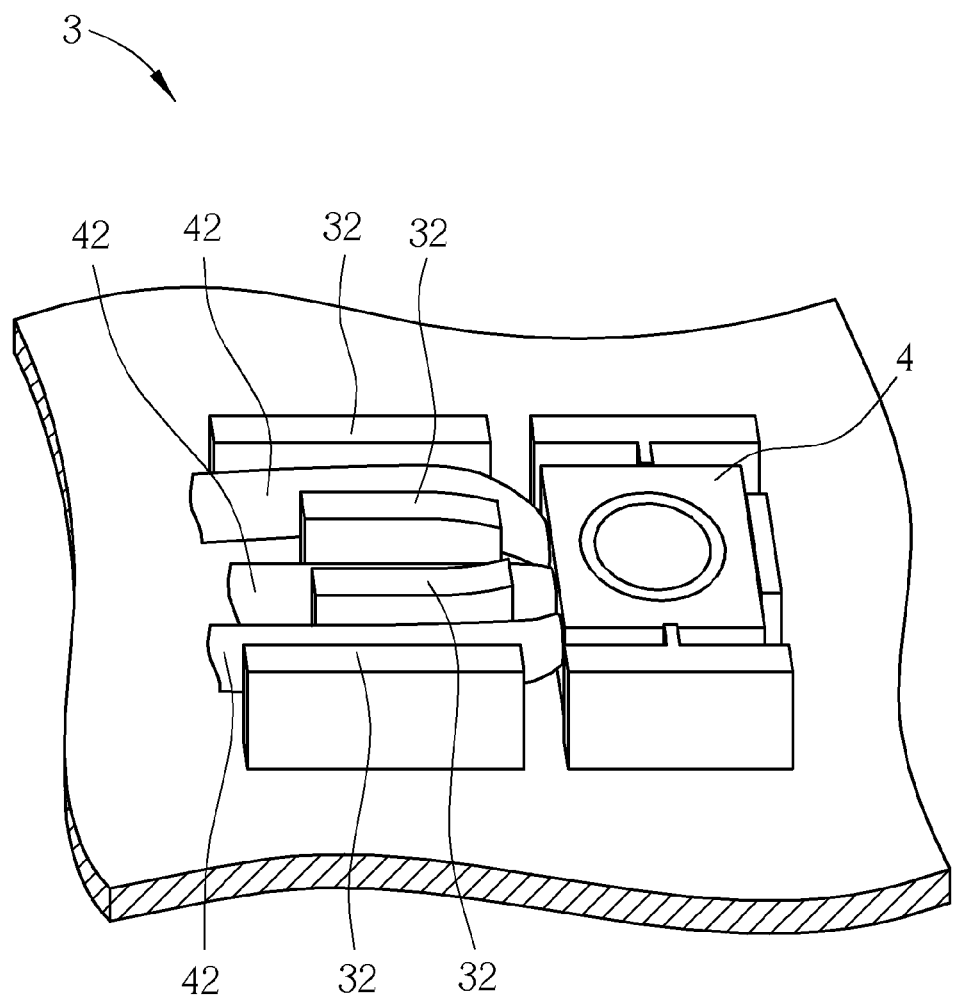
FIG. 3 is a schematic diagram of another single-side cable-arrangement structure according to the prior art.
Figure 4:
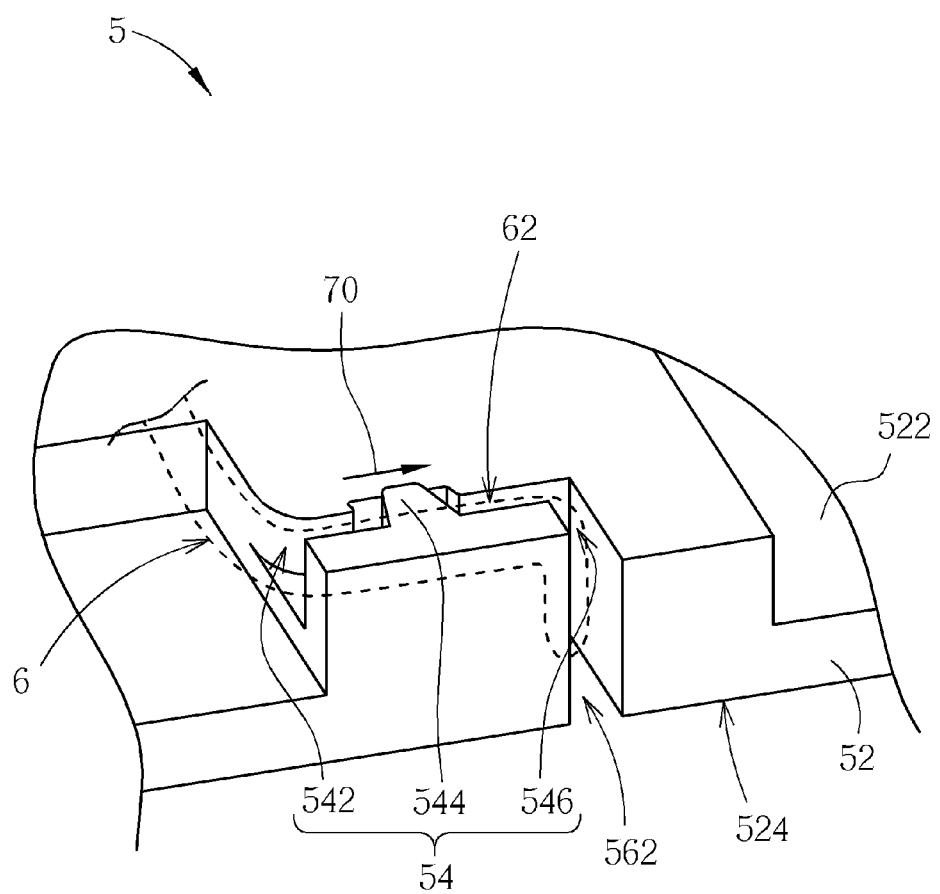
FIG. 4 is a schematic diagram of a two-side cable-arrangement structure according to a preferred embodiment of the invention.
Figure 5:
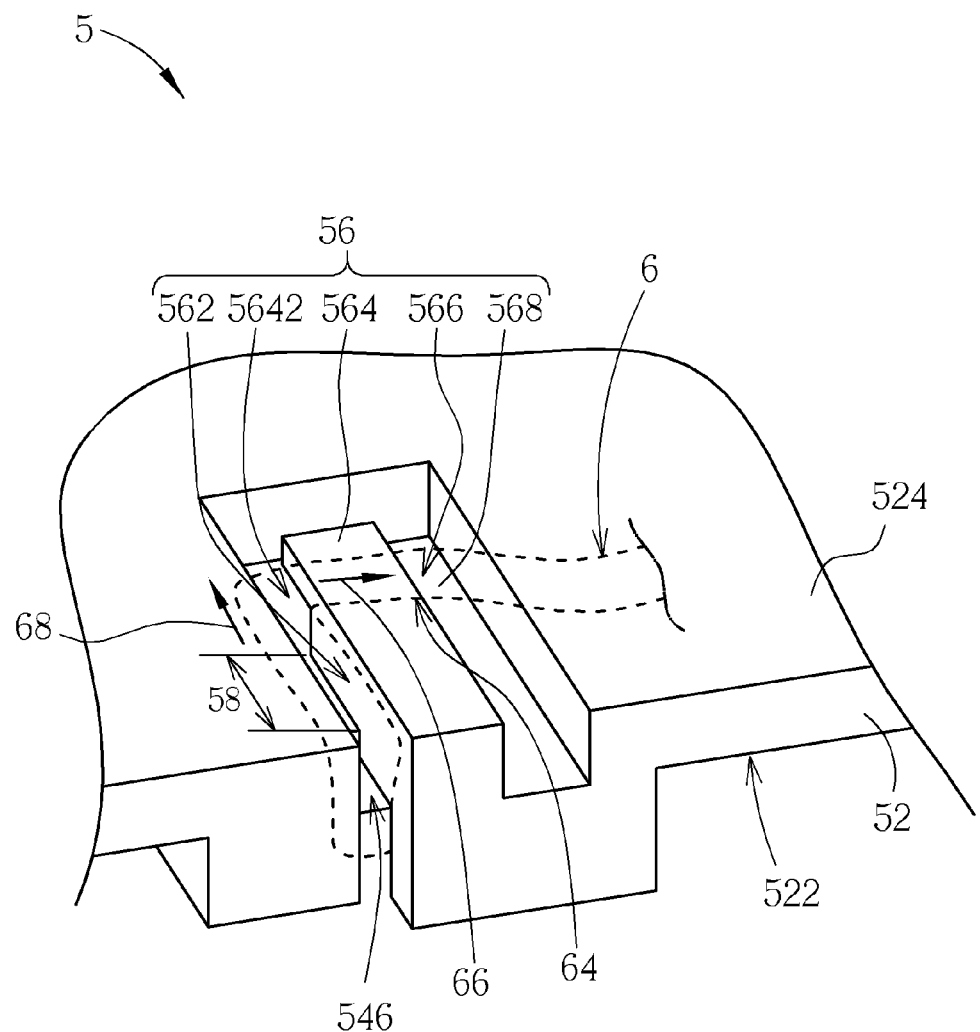
FIG. 5 is a schematic diagram of the two-side cable-arrangement structure in FIG. 4 in another view.

Please refer to FIG. 4 and FIG. 5. FIG. 4 is a schematic diagram of a two-side cable-arrangement structure 5 according to a preferred embodiment of the invention. FIG. 5 is a schematic diagram of the two-side cable-arrangement structure 5 in FIG. 4 in another view. The two-side cable-arrangement structure 5 is used for fixing a cable (shown in dashed lines in the figures). The two-side cable-arrangement structure 5 includes a plate 52, a first cable-arrangement structure 54, and a second cable-arrangement structure 56. The plate 52 includes a first side 522 and a second side 524. The first side 522 is opposite to the second side 524. The first cable-arrangement structure 54 is disposed on the first side 522 for fixing a first portion 62 of the cable 6 on the first side 522. The second cable-arrangement structure 56 is disposed on the second side 524 for fixing a second portion 64 extending from the first portion 62 of the cable 6 on the second side 524.

Further, the first cable-arrangement structure 54 substantially forms a cable passage which includes a cable inlet 542, a holding part 544, and a cable outlet 546. The second cable-arrangement structure 56 also substantially forms a cable passage which includes a cable inlet 562, a holding part 564, and a cable outlet 566. The first portion 62 of the cable 6 passes through the cable inlet 542, the cable outlet 546 of the first cable-arrangement structure 54 and is fixed by the holding part 544 of the first cable-arrangement structure 54. In this embodiment, the cable outlet 546 of the first cable-arrangement structure 54 communicates with the cable inlet 562 of the second cable-arrangement structure 56, so the cable 6 directly crosses the plate 52 to from the first cable-arrangement structure 54 enter the second cable-arrangement structure 56; however, the invention is not limited to this. The second portion 64 of the cable 6 passes through the cable inlet 562 and the cable outlet 566 of the second cable-arrangement structure 56 and is fixed by the holding part 564 of the second cable-arrangement structure 56.

In this embodiment, the holding part 564 of the second cable-arrangement structure 56 is used for fixing the second portion 64 of the cable 6 so that the fixed portion of the second portion 64 of the cable 6 extends along a first fixing direction 66. In the operation of fixing the cable 6, because the holding part 564 has an open 5642, a user can dispose the second portion 64 of the cable 6 along a direction perpendicular to the first fixing direction 66 from the open 5642 into the holding part 564, so that the second portion 64 of the cable 6 is fixed. In addition, there is a distance 58 along the direction perpendicular to the first fixing direction 66 between the cable inlet 562 and the holding part 564. Therefore, after passing through the cable inlet 562 of the second cable-arrangement structure 56, the second portion 64 of the cable 6 extends along a first direction 68 and is bent to extend along a second direction (i.e. the first fixing direction 66), so as to be fixed by the holding part 564. Furthermore, because the cable inlet 562 is shifted relatively to the open 5642, the cable inlet 562 is also conducive to preventing the cable 6 from departing from the open 5642.

In addition, because of the bending of the cable 6 due to the traverse of the cable 6 across the plate 52, the cable 6 is bent several times to be fixed. Thereby, the cable 6 suffers multiple constraints, which increases the constraint force on the cable 6 produced by the first cable-arrangement structure 54 and a second cable-arrangement structure 56 when respectively fixing the cable 6 and is further conducive to fixing the cable 6.

In this embodiment, the first portion 62 of the cable 6 is simply disposed in a narrow groove and fixed by the holding part 544 so that the first portion 62 of the cable 6 extends along a second fixing direction 70. The second fixing direction 70 is reverse to the first fixing direction 66. In other words, the cable 6 extends mainly along a third direction (i.e. the second fixing direction 70) before entering the second cable-arrangement structure 56, and extends mainly along the second direction (i.e. the first fixing direction 66) reverse to the third direction after entering the second cable-arrangement structure 56. Therefore, the extending path of the cable 6 is conducive to reducing the movement along the path and to fixing the cable 6. In this embodiment, the first cable-arrangement structure 54 and the second cable-arrangement structure 56 are not wholly symmetric, but the invention is also applied to a case of a symmetric structure without further descriptions.

Figure 6:
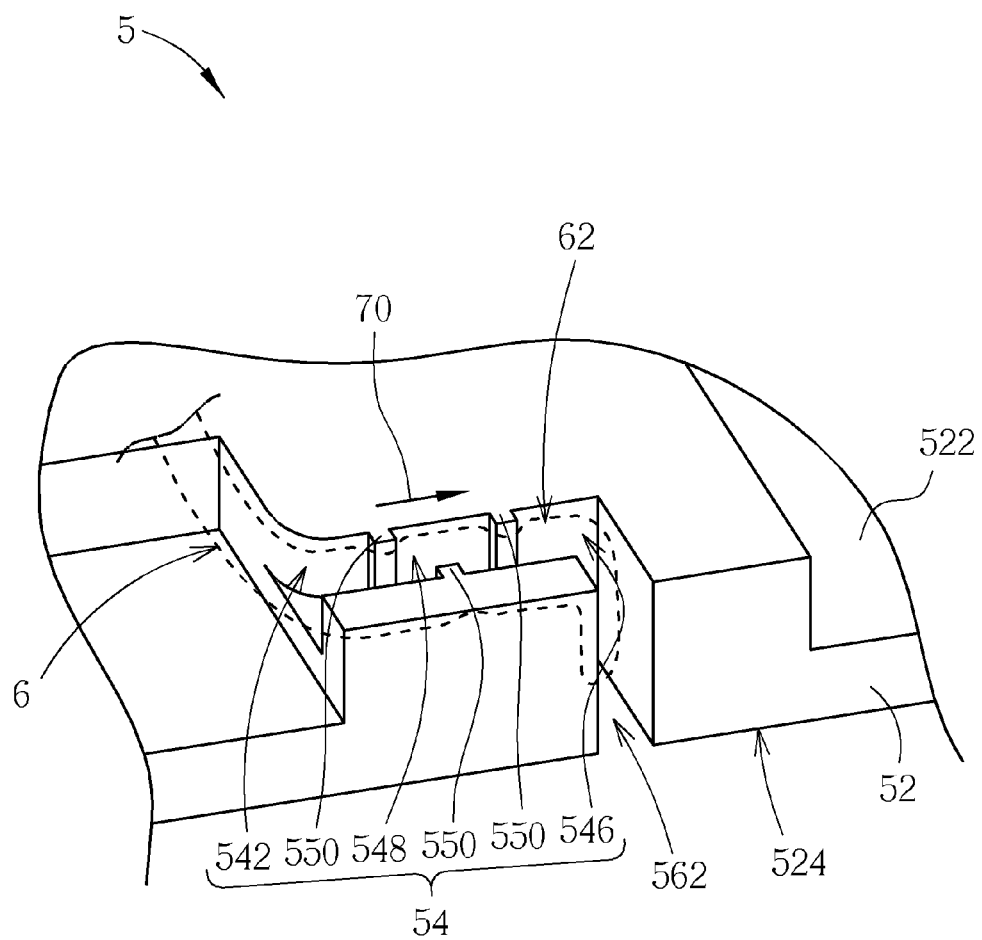
FIG. 6 is a schematic diagram of the first cable-arrangement structure according to another embodiment of the invention.

It is added that, in this embodiment, the first cable-arrangement structure 54 uses the similar fixing means to that used by the second cable-arrangement structure 56; that is, the holding part 544 compresses the cable 6 for preventing the cable 6 from departing from the cable passage formed by the first cable-arrangement structure 54. However, the invention is not limited to this. Please refer to FIG. 6, which is a schematic diagram of the first cable-arrangement structure 54 according to another embodiment of the invention. A cable passage formed by the first cable-arrangement structure 54 is a groove 548, of which there is at least one protrusion spots 550 disposed on the two sides. The first portion 62 of the cable 6 passes through the cable inlet 542 and the cable outlet 546 and is fixed in the groove 548 by the protrusion spots 550 protruding toward the groove 548. The holding part 544 in FIG. 4 and the protrusion spots 550 in FIG. 6 can also be used together without specially pointing out.

Please refer to FIG. 5. In the above embodiments, the cable 6 leaves the two-side cable-arrangement structure 5 from the cable outlet 566. The cable 6 usually extends out of an electronic apparatus accommodating the two-side cable-arrangement structure 5, so a user may pull or push the exposed cable 6. When the user pulls the exposed cable 6, the holding part 564 can resist pulling the cable 6 from the second cable-arrangement structure 56. When the user pushes the exposed cable 6, the cable 6 is blocked by the wall at the cable outlet 566 of the second cable-arrangement structure 56 so that the second portion 64 of the cable 6 will not be loosened or depart from the holding part 564. Therefore, the two-side cable-arrangement structure 5 of the invention can fix the cable 6 efficiently and greatly reduce the possibility of the cable loosing due to pulling or pushing the cable 6 by the user.

Figure 7:
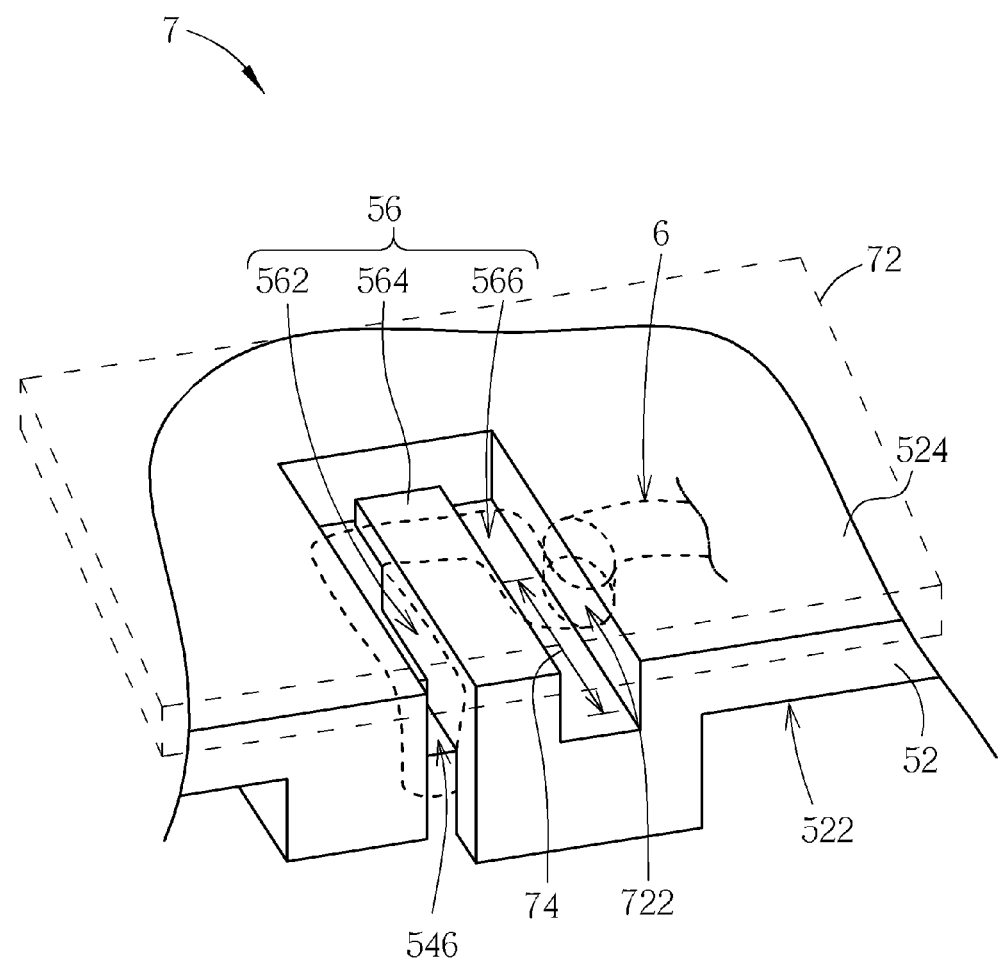
FIG. 7 is a schematic diagram of an electronic apparatus according to another preferred embodiment of the invention.

Please refer to FIG. 7, which is a schematic diagram of an electronic apparatus 7 according to another preferred embodiment of the invention. The electronic apparatus 7 includes a casing 72 (shown in dashed lines) and the abovementioned two-side cable-arrangement structure 5. The casing 72 is engaged with the plate 52 and has a through hole 722; the detail of the engagement is not shown in FIG. 7. The casing 72 of the electronic apparatus 7 usually forms an accommodating space for accommodating the plate 52 and other electronic components. The cable 6 is usually connected to an electronic component, is fixed by the two-side cable-arrangement structure 5, and passes through the through hole 722 to the exterior of the electronic apparatus 7. The cable 6 could be an FM antenna, a power cable or other cables.

Because it is necessary for the user to pull or push the exposed portion of the cable 6 through the through hole 722, the position of the through hole 722 affects the pulling or pushing. In this embodiment, there is a distance 74 along a direction perpendicular to the second direction (i.e. the first fixing direction 66) between the projection of the through hole 722 on the plate 52 and the holding part 564 of the second cable-arrangement structure 56; that is, the projection is shifted by the distance 74 along the direction along which the cable 6 enters into the holding part 564 to be held. Thereby, when the user pulls the cable 6, it is more difficult to pull the cable 6 to be loosened because the cable 6 is constrained by the through hole 722 and then held by the holding part 564. When the user pushes the cable 6, the fixed portion of the second portion 64 of the cable 6 cannot be directly loosened by the pushing because there is the distance 74 between the projection of the through hole 722 and the cable outlet 566. In a general case, the pushed cable 6 is stopped by the plate 52, so the second cable-arrangement structure 56 affect less the fixing effect on the cable 6.

Therefore, the cable-arrangement structures are disposed on the two sides of the plate of the two-side arrangement structure of the invention, so that the cable is double fixed by the cable-arrangement structures on the two sides, which provides the fixing effect in multiple directions on the cable. The portions of the cable fixed by the two cable-arrangement structures pull each other to produce a constraint force on both of the portions. The constraint force is conducive to preventing the cable from moving so as to enhance the fixing on the cable. In addition, besides having the abovementioned fixing effect on the cable, the electronic apparatus with the two-side cable-arrangement structure of the invention can greatly reduce the effect of loosening the cable by the user pulling or pushing the exposed portion of the cable. Therefore, the two-side cable-arrangement structure and the electronic apparatus with the two-side cable-arrangement structure of the invention solve the problem in the prior art that a user pulls or pushes a exposed portion of a cable fixed on a single cable-arrangement structure to loosen the cable, even damage the cable.

Those skilled in the art will readily observe that numerous modifications and alterations of the device and method may be made while retaining the teachings of the invention.

What is claimed is:

1. An electronic apparatus with two-side cable-arrangement structure, the electronic apparatus comprising:
   a cable having a first portion and a second portion extending from the first portion;
   a plate having a first side and a second side, the first side being opposite to the second side;
   a first cable-arrangement structure disposed on the first side for fixing the first portion on the first side, the first portion of the cable extending along a third direction;
   a second cable-arrangement structure disposed on the second side for fixing the second portion on the second side, the second cable-arrangement structure comprising a cable inlet, a holding part, and a cable outlet, the second portion of the cable passing through the cable inlet, extending along a first direction, extending along a second direction after being bent so as to be fixed by the holding part, and passing through the cable outlet, the second direction being reverse to the third direction; and
   a casing being engaged with the plate and having a through hole, the cable passing through the through hole.

2. The electronic apparatus of claim 1, wherein the first cable-arrangement structure comprises a cable inlet, a holding part, and a cable outlet, and the first portion of the cable passes through the cable inlet and the cable outlet and is fixed by the holding part.

3. The electronic apparatus of claim 1, wherein the first cable-arrangement structure comprises a cable inlet, a groove, and a cable outlet, and the first portion of the cable passes through the cable inlet and the cable outlet and is fixed in the groove.

4. The electronic apparatus of claim 1, wherein the holding part has an open, and the second portion of the cable along a direction perpendicular to the second direction enters the holding part from the open to be fixed.

5. The electronic apparatus of claim 1, wherein the cable inlet communicates directly with a cable outlet of the first cable-arrangement structure.

6. The electronic apparatus of claim 3, wherein at least one protrusion spot is disposed on a side of the groove for fixing the first portion of the cable in the groove.

7. The electronic apparatus of claim 4, wherein there is a distance along the direction perpendicular to the second direction between a projection of the through hole onto the plate and the holding part.

8. An electronic apparatus with two-side cable-arrangement structure, the electronic apparatus comprising:
   a cable having a first portion and a second portion extending from the first portion;
   a plate having a first side and a second side, the first side being opposite to the second side;
   a first cable-arrangement structure disposed on the first side for fixing the first portion on the first side;
   a second cable-arrangement structure disposed on the second side for fixing the second portion on the second side, the second cable-arrangement structure comprising a cable inlet, a holding part, and a cable outlet, the holding part having an open, the second portion of the cable passing through the cable inlet, extending along a first direction, extending along a second direction after being bent so as to be fixed by the holding part, and passing through the cable outlet, wherein the second portion of the cable along a direction perpendicular to the second direction enters the holding part from the open to be fixed; and
   a casing being engaged with the plate and having a through hole, the cable passing through the through hole.

9. The electronic apparatus of claim 8, wherein the first cable-arrangement structure comprises a cable inlet, a holding part, and a cable outlet, and the first portion of the cable passes through the cable inlet and the cable outlet and is fixed by the holding part.

10. The electronic apparatus of claim 8, wherein the first cable-arrangement structure comprises a cable inlet, a groove, and a cable outlet, and the first portion of the cable passes through the cable inlet and the cable outlet and is fixed in the groove.

11. The electronic apparatus of claim 8, wherein there is a distance along the direction perpendicular to the second direction between a projection of the through hole onto the plate and the holding part.

12. The electronic apparatus of claim 8, wherein the cable inlet communicates directly with a cable outlet of the first cable-arrangement structure.

13. The electronic apparatus of claim 10, wherein at least one protrusion spot is disposed on a side of the groove for fixing the first portion of the cable in the groove.

* * * * *